(12) United States Patent
Inami et al.

(10) Patent No.: US 11,474,169 B2
(45) Date of Patent: Oct. 18, 2022

(54) MAGNETIC MATERIAL OBSERVATION METHOD, AND MAGNETIC MATERIAL OBSERVATION APPARATUS

(71) Applicant: National Institutes for Quantum Science and Technology, Chiba (JP)

(72) Inventors: Toshiya Inami, Hyogo (JP); Tetsu Watanuki, Hyogo (JP); Tetsuro Ueno, Hyogo (JP); Ryo Yasuda, Hyogo (JP)

(73) Assignee: National Institutes for Quantum Science and Technology, Chiba (JP)

( * ) Notice: Subject to any disclaimer, the term of this patent is extended or adjusted under 35 U.S.C. 154(b) by 319 days.

(21) Appl. No.: 16/647,884

(22) PCT Filed: Mar. 22, 2019

(86) PCT No.: PCT/JP2019/012018
§ 371 (c)(1),
(2) Date: Mar. 17, 2020

(87) PCT Pub. No.: WO2019/182097
PCT Pub. Date: Sep. 26, 2019

(65) Prior Publication Data
US 2020/0249288 A1 Aug. 6, 2020

(30) Foreign Application Priority Data
Mar. 22, 2018 (JP) .............................. JP2018-054701

(51) Int. Cl.
*G01R 33/12* (2006.01)
*G01N 23/22* (2018.01)
(Continued)

(52) U.S. Cl.
CPC .......... *G01R 33/12* (2013.01); *G01N 23/2252* (2013.01); *G01R 33/032* (2013.01); *H01J 37/222* (2013.01); *H01J 37/266* (2013.01)

(58) Field of Classification Search
CPC .. G01R 33/12; G01R 33/032; G01N 23/2252; H01J 37/222; H01J 37/266
(Continued)

(56) References Cited

U.S. PATENT DOCUMENTS 5,936,244 A 8/1999 Yajima et al.
6,313,461 B1 * 11/2001 McClelland ........... B82Y 15/00
250/307
(Continued)

FOREIGN PATENT DOCUMENTS

JP 545304 A 2/1993
JP H07198631 A 8/1995
(Continued)

OTHER PUBLICATIONS

ISA/JP, International Search Report for corresponding PCT Patent Application No. PCT/JP2019/012018, dated Jun. 18, 2019, 2 pages.
(Continued)

*Primary Examiner* — Nicole M Ippolito
(74) *Attorney, Agent, or Firm* — NK Patent Law

(57) ABSTRACT

A magnetic material observation method in accordance with the present invention includes: an irradiating step including irradiating a region of a sample with an excitation beam and thereby allowing a magnetic element contained in the sample to radiate a characteristic X-ray; a detecting step including detecting intensities of a right-handed circularly polarized component and a left-handed circularly polarized component contained in the characteristic X-ray; and a calculating step including calculating the difference between the intensity of the right-handed circularly polarized component and the intensity of the left-handed circularly polarized component. Reference to such a difference enables precise measurement of the direction or magnitude of magnetization without strict limitations as to the sample.

14 Claims, 3 Drawing Sheets

(51) Int. Cl.
*G01R 33/032* (2006.01)
*H01J 37/22* (2006.01)
*H01J 37/26* (2006.01)
*G01N 23/2252* (2018.01)

(58) Field of Classification Search
USPC .................................................. 250/306, 307
See application file for complete search history.

(56) References Cited

U.S. PATENT DOCUMENTS

| | | | |
|---|---|---|---|
| 8,207,503 B2 * | 6/2012 | Goulon | G01T 1/24 |
| | | | 257/E47.001 |
| 8,636,980 B2 * | 1/2014 | Elgort | A61B 5/01 |
| | | | 424/9.3 |
| 9,766,190 B2 * | 9/2017 | Yano | G01N 23/085 |
| 2010/0086104 A1 | 4/2010 | Michaelsen et al. | |
| 2012/0291161 A1 | 11/2012 | Zhang et al. | |
| 2017/0062088 A1 | 3/2017 | Nakayama et al. | |
| 2017/0199135 A1 * | 7/2017 | Yano | G01N 23/083 |

FOREIGN PATENT DOCUMENTS

| | | | |
|---|---|---|---|
| JP | 2008066080 A | 3/2008 | |
| JP | 2012211771 A | 11/2012 | |
| JP | 2012233845 A | 11/2012 | |
| JP | 201383454 A | 5/2013 | |
| JP | 2017044557 A | 3/2017 | |
| JP | 2017191066 A | 10/2017 | |
| WO | 9701862 A1 | 1/1997 | |
| WO | 2016147320 A1 | 9/2016 | |

OTHER PUBLICATIONS

Inami Toshiya: "Magnetic Circular Dichroism in X-Ray Emission From Ferromagnets", Physical Review Letters, Sep. 17, 2017, 119, 137203, 6 pages.
Teruo Kohashi: "Spin-polarized scanning electron microscopy (spin SEM)", Microscope, vol. 48, No. 1 (2013), pp. 15-19, 5 pages.
WIPO, English translation of International Preliminary Report on Patentability for corresponding PCT Patent Application No. PCT/JP2019/012018, dated Oct. 1, 2020, 11 pages.
Duda, L.-C. et al.: "A helicity resolving soft X-ray emission spectrometer for studying magnetic circular dichroism with laboratory excitation sources", Nuclear Instruments & Methods in Physics Research, Section A, Elsevier BV * North-Holland, NL, vol. A376, No. 2, Jul. 1, 1996 (Jul. 1, 1996), pp. 291-297, XP004018581, ISSN: 0168-9002, DOI: 10.1016/0168-002(96)00263-X.
EPO, Extended European Search Report for corresponding European Patent Application No. 19771291.2, dated Nov. 19, 2021, 9 pages.

* cited by examiner

MAGNETIC MATERIAL OBSERVATION METHOD, AND MAGNETIC MATERIAL OBSERVATION APPARATUS

CROSS-REFERENCE TO RELATED APPLICATIONS

This application is a U.S. National Stage application of International Patent Application No. PCT/JP2019/012018, filed on Mar. 22, 2019, which claims priority to Japanese Patent Application No. 2018-054701, filed on Mar. 22, 2018, the entire content of all of which is incorporated by reference herein.

TECHNICAL FIELD

The present invention relates to a method of observing a direction of magnetization or magnitude of magnetization of a magnetic material, and an apparatus to observe the direction of magnetization or the magnitude of magnetization of a magnetic material.

BACKGROUND ART

A micro geometric structure on the surface of a substance can be easily observed under an optical microscope or a scanning electron microscope (SEM). Also, a micro two-dimensional distribution of elemental composition on the surface of a substance can be made visually perceptible by detecting characteristic X-rays that are generated when an electron beam is applied in a scanning electron microscope. Scanning electron microscopes having such a function are widely used as disclosed in, for example, Patent Literature 1. On the other hand, for example, in developing a material based on a magnetic material such as a permanent magnet, electrical steel sheet, or magnetic recording medium, it is also desirable that a two-dimensional structure of magnetic domains (each of which is a region in which the magnetization is in a uniform direction) (such a structure is referred to as magnetic domain structure) be made perceptible.

A technique in which a scanning electron microscope is provided with the functions for observing a magnetic domain structure is, for example, a spin-SEM disclosed in Non-patent Literature 1. Spin polarization of secondary electrons emitted from a ferromagnetic material upon irradiation of the ferromagnetic material with an electron beam relates to magnetization of the ferromagnetic material. The spin-SEM disclosed in Patent Literature 1 utilizes this fact, that is, measures the spin polarization of secondary electrons and thereby displays an image of a two-dimensional structure of magnetization (two-dimensional magnetic domain structure) together with a normal image of secondary electrons obtained under a scanning electron microscope.

Patent Literature 2 discloses a magnetic force microscope that makes a magnetic domain structure perceptible as an image. According to the magnetic force microscope disclosed in Patent Literature 2, a cantilever for use in an atomic force microscope is provided with a magnetic film, and thereby makes it possible to map magnetic fields leaked from a sample. This makes a magnetic domain structure perceptible as an image. Patent Literature 3 discloses an observation instrument in which a spin current injector is joined to a sample and then a voltage is applied, and a thermal image (infrared image) of the sample is obtained, thereby making it possible to make a magnetic domain structure perceptible in an image.

Furthermore, an observation method using a magneto-optical Kerr effect microscope is known as a method of observing a magnetic domain structure. This is a method by which visible light or ultraviolet light is applied on the surface of a magnetic material sample and changes in polarization of reflected light are measured. This method enables observation of a magnetic domain structure by utilizing the fact that, due to the magneto-optical Kerr effect, the polarization of reflected light changes according to the direction of magnetization and the magnitude of magnetization in a measurement target.

Another known method of observing a magnetic domain structure is an observation method using an X-ray magnetic circular dichroism (XMCD) microscope. This method utilizes the property that the proportion of an X-ray absorbed by a magnetic material sample when the sample is irradiated with a circularly polarized X-ray varies depending on whether the direction of rotation of the circularly polarized light is right-handed or left-handed (such a property is "MCD"), and determines the direction of magnetization and the magnitude of magnetization of the sample from the difference between the proportions of the absorbed right-handed circularly polarized light and of the absorbed left-handed circularly polarized light. A magnetic domain observation using an XMCD microscope is performed at an absorption edge of a specific element in the measured sample, and therefore makes it possible to selectively carry out measurement with regard to a desired element (element-selective measurement).

The XMCD microscope can be categorized into a soft X-ray MCD microscope or a hard X-ray MCD microscope, depending on the energy of an X-ray utilized. Examples of a soft X-ray MCD microscope include transmission microscopes, microscopes based on electron yield, and microscopes based on secondary ion yield. Examples of a hard X-ray MCD microscope include transmission microscopes and microscopes based on fluorescence yield.

CITATION LIST

Patent Literature

[Non-patent Literature 1]
Spin-Polarized Scanning Electron Microscopy (Spin-SEM)", Teruo Kohashi, *KENBIKYO*, Vol. 48, No. 1, page 15 (2013)
[Patent Literature 1]
Japanese Patent Application Publication Tokukai No. 2017-44557
[Patent Literature 2]
Japanese Patent Application Publication Tokukai No. 2012-233845
[Patent Literature 3]
Japanese Patent Application Publication Tokukai No. 2017-191066

SUMMARY OF INVENTION

Technical Problem

Magnetic materials such as permanent magnets, electrical steel sheets, and magnetic recording media are widely used in devices such as an electric motor, a transformer, and a hard disk drive, and it is an important objective in industry to improve the performance of the magnetic materials. In material development of magnetic materials, it is important to observe a magnetic domain structure of a magnetic material. To observe the magnetic domain structure, various attempts have been made as described above. Such observations of a magnetic domain structure using conventional techniques, however, are generally intended to observe a magnetic domain structure on the surface of a sample, and are difficult to observe a magnetic domain structure inside a sample.

For example, in a case where measurement concerning secondary electrons is carried out like a technique disclosed in Non-patent Literature 1, due to low penetrability of secondary electrons through a sample, the maximum measurable depth is only about 1 nm. It is therefore impossible to observe a magnetic domain structure inside a magnetic material (for example, a region at a depth of about several micrometers or deeper). Therefore, in order to observe a magnetic domain structure inside a magnetic material using such a magnetic domain observation method, it is necessary to pre-treat a sample such as slicing the sample into a thin layer or performing surface polishing.

With regard to an XMCD microscope, only synchrotron X-ray can be used as an excitation beam. Furthermore, as for hard X-ray MCD, dichroism is low (low sensitivity) for 3d transition metal elements (such as Fe, Co, Ni) which are known as typical elements included in a magnetic material, and therefore the hard X-ray MCD is difficult to use for general purposes in observation of a magnetic domain structure of a magnetic material.

In particular, a transmission XMCD microscope cannot be used to observe a magnetic domain structure, unless a sample has a thickness through which an applied X-ray can pass. Therefore, generally, in a case of observing a magnetic domain structure using a transmission XMCD microscope, it is necessary to pre-slice a sample into a thin layer so that an applied X-ray can pass through it. In a case of MCD microscopes other than the transmission XMCD microscope, it is not necessary to slice the sample into a thin layer; however, in cases of a soft X-ray MCD microscope based on electron yield and a soft X-ray MCD microscope based on secondary ion yield, their maximum detectable depths depend on the escape depths of electrons. Therefore, also in such cases, the maximum measurable depths thereof are only about several nanometers.

The magneto-optical Kerr effect microscopy is, as described earlier, a method by which a magnetic domain structure is observed using reflected light. Therefore, it is necessary to subject the surface of a sample to mirror polishing (e.g., mechanical polishing such as polishing using diamond or alumina abrasive, chemical polishing using an acid or an alkali, or the like) before observation. Furthermore, the conditions under which the surface treatment is carried out may affect observation results.

Furthermore, the surface of a magnetic sample such as a permanent magnet, electrical steel sheet, or magnetic recording medium may be coated with some layer by a coating treatment or may have an inevitable film formed thereon such as an oxide film. According to conventional magnetic domain structure observation methods, the maximum measurable depth is generally less than the thickness of such a coating or film, and therefore it is difficult to directly observe a magnetic domain structure of a magnetic material sample without removing the coating or film. Therefore, in order to observe a magnetic domain structure of a sample having a coating or film thereon, it is necessary to pre-treat the sample such as removing the coating or film from the sample.

There has also been a report that a magnetic domain structure may change due to the above treatment of a sample (e.g., slicing the sample into a thin layer, removing a coating/film from the sample). Specifically, a magnetic domain structure of an exposed surface, which has been made exposed on the surface of the sample by the above treatment, may be different from what it was before the treatment (i.e., different from a magnetic domain structure that was present within the magnetic material). It is therefore difficult to observe a magnetic domain structure inside a magnetic material.

As has been described, conventional magnetic domain structure observation methods have many restrictions in that, for example, the maximum measurable depth is limited and/or pre-treatment of a sample such as smoothing the surface of a sample or slicing a sample into a thin layer is essential, and such restrictions hinder the widespread use and utilization of the magnetic material observation techniques. In view of such circumstances, there is a demand for a magnetic material observation technique that is not strictly limited as to a sample and that is capable of precisely measuring the direction of magnetization or magnitude of magnetization.

An aspect of the present invention was made in view of the above issue, and an object thereof is to provide a magnetic material observation technique that is not strictly limited as to a sample and that is capable of precisely measuring the direction of magnetization or magnitude of magnetization.

Solution to Problem

The inventors of the present invention put their attention on a characteristic X-ray that is generated upon irradiation of a magnetic material with an excitation beam, and conducted a diligent study. As a result, the inventors for the first time found that the characteristic X-ray contains a substantial amount (amount that is easily measurable) of circularly polarized components, and that the direction of rotation of each circularly polarized component varies depending on the direction of magnetization (i.e., change occurs in the proportions of a right-handed circularly polarized component and a left-handed circularly polarized component contained in the characteristic X-ray). The inventors then found that the direction of magnetization or magnitude of magnetization of a magnetic material can be observed by measuring such circular polarizations of the characteristic X-ray. On the basis of these findings, the inventors accomplished the present invention. Note that, in this specification, the scope of the meaning of the expression "observe a direction of magnetization or a magnitude of magnetization" includes (1) an aspect in which only the direction of magnetization is observed, (2) an aspect in which only the magnitude of magnetization is observed, and (3) an aspect in which both the direction of magnetization and the magnitude of magnetization are observed.

In order to attain the above object, the present invention includes the following features.

A magnetic material observation method in accordance with an aspect of the present invention is a method for observing a direction of magnetization or a magnitude of magnetization of a sample that contains a magnetic material, the method including: an irradiating step including irradiating a region of the sample with an excitation beam, the excitation beam being a beam that allows an element included in the magnetic material to radiate a characteristic X-ray upon irradiation of the sample with the beam; a detecting step including recognizing, as intensities of two circularly polarized components in respective rotation directions, the characteristic X-ray radiated from the element upon irradiation of the sample with the excitation beam; and a calculating step including calculating a difference between the intensities of the two circularly polarized components recognized in the detecting step.

A magnetic material observation apparatus in accordance with another aspect of the present invention is an apparatus for observing a direction of magnetization or a magnitude of magnetization of a sample that contains a magnetic material, the magnetic material observation apparatus including: an excitation beam source configured to emit an excitation beam, the excitation beam being a beam that allows an element included in the magnetic material to radiate a characteristic X-ray upon irradiation of the sample with the beam; a detecting section configured to detect the characteristic X-ray, radiated by the element upon irradiation of the sample with the excitation beam, as circularly polarized components different in direction of rotation, the circularly polarized components being a right-handed circularly polarized component and a left-handed circularly polarized component; and a data processing section configured to carry out output of values each calculated from a difference between an intensity of the right-handed circularly polarized component and an intensity of the left-handed circularly polarized component.

Advantageous Effects of Invention

According to an aspect of the present invention, it is possible to provide a magnetic material observation technique that is not strictly limited as to a sample and that is capable of precisely measuring the direction of magnetization or magnitude of magnetization.

DESCRIPTION OF EMBODIMENTS

Definition of Terms

Figure 1:
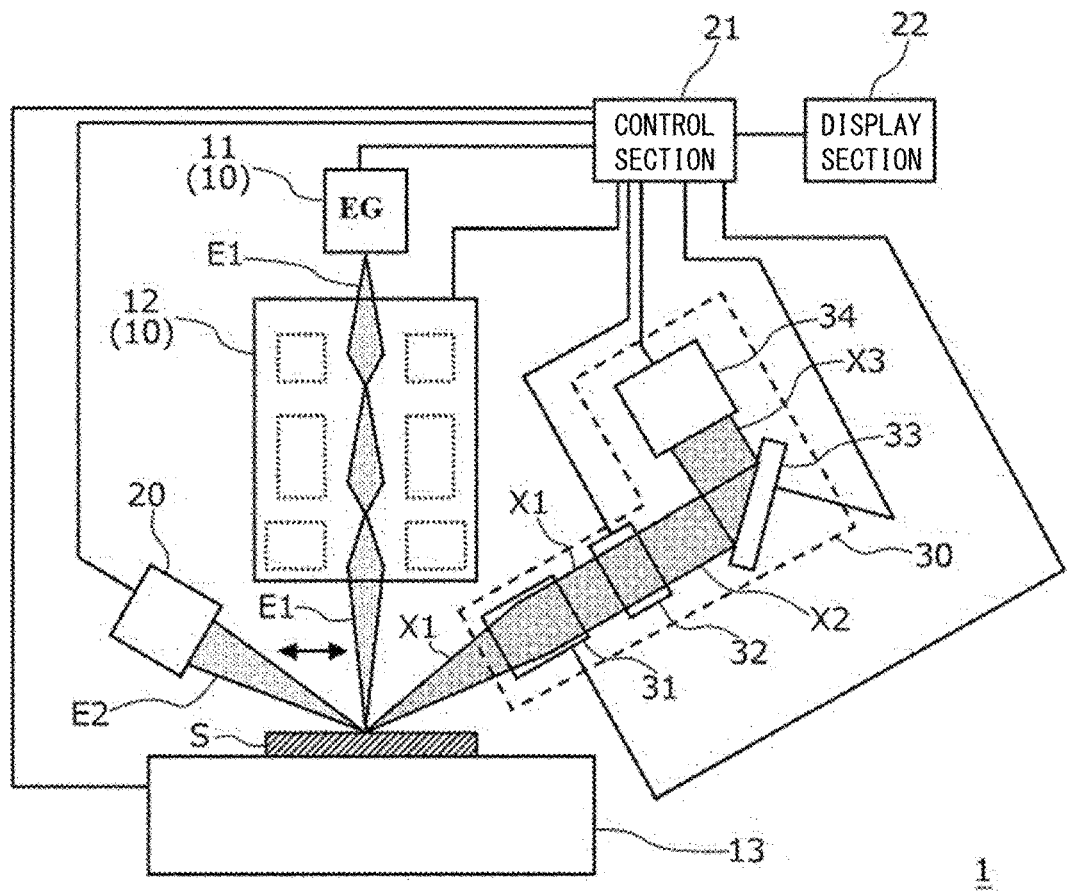
FIG. 1 illustrates a configuration of a magnetic material observation apparatus in accordance with an embodiment of the present invention.

In this specification, the term "magnetic material" refers to a substance that can become magnetic. In other words, a magnetic material is a substance containing atoms that can have a magnetic moment. Assume that, in this specification, a magnetic material is a substance that can achieve a state in which the magnetic moments of the respective atoms are in a uniform direction and that as a whole has magnetization (so-called ferromagnetic material or ferrimagnetic material). A magnetic material contains a magnetic element such as iron and/or cobalt in many cases.

In this specification, the term "magnetic domain" refers to a region, within a magnetic material, in which magnetization is in a uniform direction. In this specification, the term "magnetic domain structure" refers to a spatial distribution of magnetic domains in a magnetic material, and contains information on the direction of magnetization or magnitude of magnetization in each magnetic domain. In other words, a magnetic domain structure contains (i) information indicative of the arrangement of magnetic domains within a magnetic material and (ii) information indicative of a direction of magnetization and/or magnitude of magnetization in each magnetic domain. Note that a magnetic domain structure may contain information other than the above information. For example, a magnetic domain structure can contain information relating to the direction of magnetization and/or magnitude of magnetization in each magnetic domain. Alternatively, a magnetic domain structure may contain information on a distribution of directions of magnetization and/or magnitudes of magnetization within a border area (magnetic domain wall) between magnetic domains.

In this specification, the term "flipping ratio" refers to the following meaning: in carrying out some measurement to find intensity, assuming that an intensity measured under Condition 1 is measured intensity $I_1$ and that an intensity measured under Condition 2 is measured intensity $I_2$, the term "flipping ratio" refers to the amount obtained by dividing the difference between such measured intensities by the sum of such measured intensities (i.e., $(I_1-I_2)/(I_1+I_2)$).

There are the following kinds of circular polarization: right-handed polarization and left-handed polarization. The right-handed polarization is circular polarization such that, when light going away from a certain point is observed from that point, the electric field vector rotates in a right-handed manner (clockwise) with time around that point. The left-handed polarization is circular polarization such that, when light going away from a certain point is observed from that point, the electric field vector rotates in a left-handed manner (counterclockwise) with time around that point. In this specification, the expression "direction of rotation of circular polarization (or circularly polarized light)" refers to the direction of rotation of such an electric field vector, and is either "right-handed" or "left-handed".

In this specification, the term "degree of circular polarization" refers to the ratio of the difference between the proportion of a right-handed circularly polarized component and the proportion of a left-handed circularly polarized component to the total luminous flux.

In this specification, the term "characteristic X-ray" refers to an X-ray that is generated, when a hole is created in a core level of an atom, through a de-excitation process. The characteristic X-ray has a substantially fixed energy determined by the energy between core levels. There is no limitation on a method to create holes in core levels of the atoms.

In this specification, the intensity of a right-handed circularly polarized component is represented as "$I^+$", whereas the intensity of a left-handed circularly polarized component is represented as "$I^-$".

[Principle of Magnetic Material Observation]

The following description will first discuss the principle of magnetic material observation (method and apparatus) disclosed herein, with reference to drawings as needed.

Upon irradiation of a magnetic material with an excitation beam, an element contained in the magnetic material radiates a characteristic X-ray. The inventors for the first time found that the characteristic X-ray contains circularly polarized components. The circularly polarized components are constituted by a right-handed circularly polarized component and a left-handed circularly polarized component.

The inventors found, for the first time, that the proportions of the right-handed circularly polarized component and the left-handed circularly polarized component contained in the characteristic X-ray change according to the direction of magnetization or magnitude of magnetization in a part irradiated with the excitation beam (i.e., a part, of the magnetic material, which has received the excitation beam). A magnetic material observation method disclosed herein, based on this finding, measures the proportions of the right-handed circularly polarized component and the left-handed circularly polarized component contained in the characteristic X-ray, and thereby observes the direction of magnetization or magnitude of magnetization (typically, a magnetic domain structure) in a part irradiated with the excitation beam.

The following description will discuss the principle of a magnetic material observation method, based on an example case in which iron is used as the magnetic material and synchrotron X-ray is used as the excitation beam. Note that a sample measured here is one obtained by applying, to the surface and inside of a magnetic material, a magnetic field parallel to the surface (a tangent plane to the surface) of the magnetic material and thereby forcing the magnetization of the magnetic material to be in a uniform direction.

Figure 3:
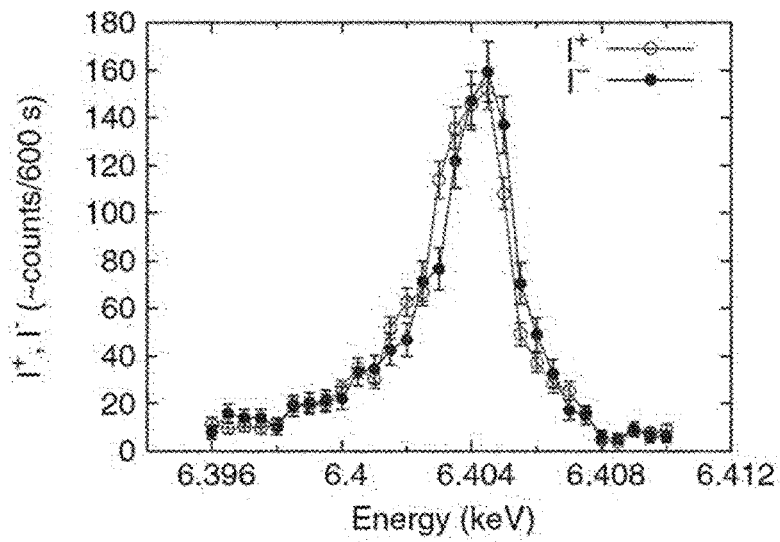
FIG. 3 shows spectra of a right-handed circularly polarized component and a left-handed circularly polarized component contained in a characteristic X-ray emitted from Fe in a case where magnetization is uniform.

FIG. 3 is a chart obtained by plotting the intensities of a right-handed circularly polarized component and a left-handed circularly polarized component (each of the intensities represents a frequency of detection, per unit time, of photons corresponding to the right-handed circularly polarized component or the left-handed circularly polarized component) against energy of a characteristic X-ray. The intensities are obtained by measuring the right-handed circularly polarized component and the left-handed circularly polarized component (i.e., circularly polarized components contained in the characteristic X-ray) in distinction from each other. In FIG. 3, open circles represent the intensities of the right-handed circularly polarized component, whereas filled circles represent the intensities of the left-handed circularly polarized component. FIG. 3 indicates that, provided that the energy of the characteristic X-ray falls within a specific range (in the example shown in FIG. 3, the range of 6.404±0.04 keV), there is a significant difference in intensity between the right-handed circularly polarized component and the left-handed circularly polarized component.

Note that the characteristic X-ray contains a polarized component, which is detected as circularly polarized light, and another polarized component that is other than the circularly polarized light (hereinafter referred to as "non-circular polarized component"). The non-circular polarized component is composed of linearly polarized light, 45° linearly polarized light, and unpolarized light. Therefore, when a right-handed circularly polarized component is detected or a left-handed circularly polarized component is detected, a non-circular polarized component is also detected together with that circularly polarized component. Therefore, strictly speaking, each of the plotted intensities of the right-handed circularly polarized component in FIG. 3 is the sum of the true intensity of the right-handed circularly polarized component and the intensity of a non-circular polarized component, whereas each of the plotted intensities of the left-handed circularly polarized component in FIG. 3 is the sum of the true intensity of the left-handed circularly polarized component and the intensity of a non-circular polarized component. Note, however, that the intensity of the non-circular polarized component detected together with the right-handed circularly polarized component and the intensity of the non-circular polarized component detected together with the left-handed circularly polarized component are each half the intensity of the non-circular polarized component contained in the characteristic X-ray, and are equal to each other. Therefore, the plotted intensities of the right-handed circularly polarized component and the left-handed circularly polarized component in FIG. 3, when shifted along a direction parallel to the vertical axis by an amount corresponding to the intensity of the non-circular polarized component detected together with the circularly polarized component, coincide with the true intensities of the right-handed circularly polarized component and the left-handed circularly polarized component, respectively. Furthermore, the difference between the plotted intensity of the right-handed circularly polarized component in FIG. 3 and the plotted intensity of the left-handed circularly polarized component in FIG. 3 equals the difference between the true intensity of the right-handed circularly polarized component and the true intensity of the left-handed circularly polarized component.

Figure 4:
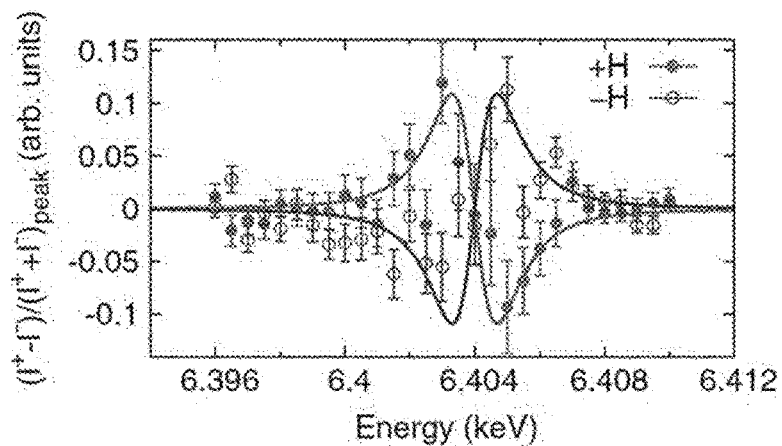
FIG. 4 shows a spectrum of the difference between intensities of the circularly polarized components, in respective rotation directions, of the characteristic X-ray emitted from Fe, measured by reversing the direction of magnetization.

FIG. 4 is a chart showing the difference between each intensity of the right-handed circularly polarized component and a corresponding intensity of the left-handed circularly polarized component, which are shown in FIG. 3, plotted against the energy of the characteristic X-ray. Filled circles each indicate a difference between the intensity of the right-handed circularly polarized component and the intensity of the left-handed circularly polarized component obtained when a magnetic field is applied so that a certain direction of magnetization is achieved, whereas open circles each indicate the difference obtained when a magnetic field is applied so that the magnetization in a direction opposite to the certain direction is achieved. FIG. 4 indicates that, when the direction of magnetization is reversed, the difference between the right-handed circularly polarized light and the intensity of the left-handed circularly polarized light reverses.

As such, it is possible, by measuring the degree of circular polarization of the characteristic X-ray whose energy falls within a specific range, to observe the direction of magnetization and/or magnitude of magnetization in an area irradiated with the excitation beam.

Furthermore, a hard X-ray, which is superior in property of penetrating a sample (such a property is hereinafter referred to as "power of penetrating", or "penetrating power"), can be used as the characteristic X-ray. When the measurement target is a characteristic X-ray falling within such a hard X-ray region, it is possible to detect circularly polarized components of the characteristic X-ray which is emitted from the inside of a sample. That is, it is possible to observe a magnetic domain structure at a depth from which the characteristic X-ray is emitted. In other words, it is possible, by selecting an appropriate excitation beam and an appropriate characteristic X-ray, to directly observe a magnetic domain structure inside a sample at a depth to which the beam and the X-ray can penetrate, without having to pre-treat the sample (such as slicing the sample into a thin layer or removing a coating/film).

Furthermore, it is generally known that the direction of magnetization differs from one magnetic domain to another and that the direction of magnetization abruptly changes at a border (magnetic wall) between magnetic domains. It is therefore possible to map a magnetic domain structure by (i) sweeping the position, irradiated with an excitation beam, across a sample and (ii) determining the direction of magnetization for each position. For example, by displaying information obtained by mapping the magnetic domain structure such that the information is superimposed on a captured image of the sample, it is possible to visualize the magnetic domain structure in a manner that is easily perceptible.

In addition to mapping using sweeping measurement, it is also possible to observe a magnetic domain structure in a direction parallel to the direction of travel of the excitation beam (i.e., magnetic domain structure in the depth direction). For example, it is possible to observe the magnetic domain structure in the depth direction by (i) carrying out measurements with respect to various depths by changing the energy of the excitation beam so that the depth in the sample reached by the excitation beam changes or (ii) carrying out measurements by changing the estimated position measured by a light-receiving optical system along the depth direction by, for example, moving up or down the sample. When the foregoing observation of the magnetic domain structure along a plane (horizontal plane) perpendicular to the direction of travel of the excitation beam by the sweeping measurement is carried out in combination with the above observation of the magnetic domain structure in the depth direction, a three-dimensional observation of a magnetic domain structure can also be achieved.

It is also known that the energy of the characteristic X-ray differs depending on what element is included in a magnetic material. It is therefore also possible, by measuring an energy spectrum of the characteristic X-ray, to map the elements included in the magnetic material. Note that this element mapping and the above magnetic domain structure observation can be carried out concurrently.

[Magnetic Material Observation Method]

Figure 6:
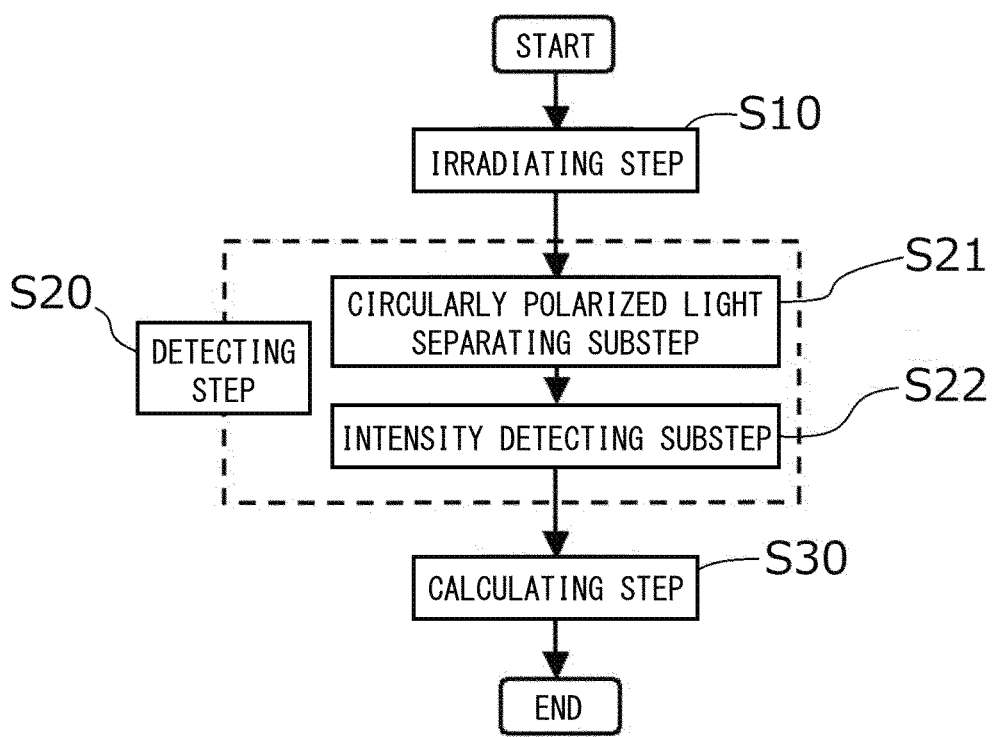
FIG. 6 is a flowchart showing a magnetic material observation method in accordance with an embodiment of the present invention.

The following description will discuss, with reference to the drawings as needed, a magnetic material observation method disclosed herein. FIG. 6 is a flowchart showing this magnetic material observation method. The magnetic material observation method disclosed herein includes: an irradiating step (S10) including irradiating a sample with an excitation beam; a detecting step (S20) including detecting circularly polarized components contained in a characteristic X-ray; and a calculating step (S30) including calculating a difference between a right-handed circularly polarized component and a left-handed circularly polarized component which are contained in the detected circularly polarized light.

The irradiating step (S10) is a step of irradiating a sample, which contains a magnetic material, with an excitation beam and allowing an element included in the magnetic material to radiate a characteristic X-ray.

The magnetic material sample observed is not particularly limited, provided that the sample contains a magnetic material. The magnetic material is a substance that can become magnetic, and contains at least one magnetic element such as iron (Fe), cobalt (Co), nickel (Ni), manganese (Mn), neodymium (Nd), samarium (Sm), gadolinium (Gd), terbium (Tb), and/or dysprosium (Dy).

For example, iron (Fe) is a typical magnetic element. A characteristic X-ray emitted from such iron (Fe) contains a hard X-ray (e.g., FeKα). By measuring such a characteristic X-ray (FeKα), it is possible to observe the direction of magnetization or magnitude of magnetization inside a sample made of iron (sample containing iron in an amount of substantially 100%). Note, here, that the inside of a sample means a region at a depth of several micrometers or more (e.g., 5 μm or more) from the surface of the sample, more preferably a region at a depth of 10 μm or more from the surface of the sample and, for example, a region at a depth of about 40 μm from the surface of the sample.

Note that the amount of the magnetic material (typically, magnetic element) contained in the sample observed is not particularly limited. In other words, provided that the sample observed includes a magnetized part (typically, a region within the sample in which a magnetic material is present or an region within the sample in which a magnetic element is present), a technique disclosed herein can be used in order to observe the direction of magnetization or magnitude of magnetization in such a magnetized part.

For example, a technique disclosed herein can be used with regard to a sample that contains a large amount (for example, 90 wt. % or more, more preferably substantially 100 wt. %) of a magnetic element(s). Alternatively, even in a case where a sample contains a small amount (for example, about 1 ppm or less) of a magnetic element(s), provided that a magnetized part of the sample observed (e.g., a region in which the magnetic element(s) is/are present) is larger than the minimum detectable size, a technique disclosed herein can be used in order to observe that magnetized part. For example, a technique disclosed herein may be used to check for the presence of a trace amount of a magnetic element(s) (magnetic material) contained in the sample and to observe the direction of magnetization or magnitude of magnetization of the magnetic element(s).

The excitation beam is not particularly limited, provided that it is possible to allow an element included in the magnetic material to radiate a characteristic X-ray.

In order to allow a characteristic X-ray to be generated, it is necessary to apply an excitation beam whose energy is equal to or greater than an energy threshold that varies from one type of characteristic X-ray to another. This energy threshold substantially depends on the element(s) included in a magnetic material, and does not strongly depend on the type of excitation beam.

Examples of the characteristic X-ray include FeKα, CoKα, NiKα, and MnKα. Table 1 shows the relationships between the energies of these characteristic X-rays and the energy thresholds for excitation energy in a case where the excitation beam is an X-ray. For example, in a case where an element included in a magnetic material is Fe, upon application of an excitation beam having an energy of 7.11 keV or greater, a characteristic X-ray having an energy of 6.404 keV is radiated (eV=electron volt). Characteristic X-rays having greater energy can more easily escape from the sample. That is, by measuring a characteristic X-ray having large energy, it is possible to achieve a deep maximum measurable depth. That is, it is possible to observe the direction of magnetization or magnitude of magnetization in an area deep inside the sample (area inside the sample).

Note that the characteristic X-rays in Table 1 are mere examples of typical characteristic X-rays that are emitted from the magnetic elements stated in Table 1, and that the magnetic elements stated in Table 1 can emit characteristic X-rays which are not shown in Table 1. For example, Fe can emit various characteristic X-rays such as FeKα$_1$, FeKα$_2$, and FeKβ.

TABLE 1

| Magnetic element | Characteristic X-ray | Energy of characteristic X-ray | Excitation energy threshold |
|---|---|---|---|
| Fe | FeK$\alpha_1$ | 6.404 keV | 7.11 keV |
| Co | CoK$\alpha_1$ | 6.930 keV | 7.71 keV |
| Ni | NiK$\alpha_1$ | 7.478 keV | 8.33 keV |
| Mn | MnK$\alpha_1$ | 5.899 keV | 6.54 keV |

Note that, in this specification, the "hard X-ray" is not particularly limited, provided that, in the detecting step (S20) (describe later), the direction of rotation of each circularly polarized component is distinguishable from the other. Note, however, that this does not imply any particular limitation. For example, an X-ray having an energy of 3 keV or greater may be regarded as "hard X-ray" in this specification.

That is, the excitation beam is not limited to an X-ray, provided that the excitation beam has an energy that is equal to or greater than the energy that can excite a magnetic element (that is, the energy that can allow a magnetic element to emit a characteristic X-ray through a de-excitation process). An excitation beam other than X-rays, for example, an electromagnetic wave beam other than X-rays, such as a gamma-ray, may be used, or a charged particle beam such as an electron beam, ion beam, positron beam, proton beam, or muon beam, or the like, may be used. In order to observe a magnetic domain structure inside a sample, it is preferable to select an excitation beam having a high power of penetrating a sample.

For example, X-rays tend to have a high power of penetrating a sample. In particular, hard X-rays (high-energy X-rays) are greater in penetrating power than soft X-rays, and therefore are preferred as an excitation beam.

For example, in a case of a magnetic material containing iron as a main constituent element (for example, electrical steel sheet or permanent magnet), use of a hard X-ray as an excitation beam makes it possible to carry out an observation at a depth of, for example, 1 μm or deeper (preferably 10 μm or more, for example, about 40 μm).

Furthermore, even in a case where a sample has a coating or film on its surface, it is possible to observe the direction of magnetization or magnitude of magnetization of a magnetic material present under the coating or film, without having to remove the coating or film. For example, provided that (1) the thickness of the coating or film is about 1 mm or less when the coating or film is composed of an epoxy resin whose constituent elements are light elements or (2) the thickness of the coating or film is about 100 μm or less when the coating or film is composed of aluminum which is a light metal, it is possible to observe the direction of magnetization or magnitude of magnetization of the magnetic material present under the coating or film without having to remove the coating or film even if the magnetic material is covered with the coating or film.

Alternatively, in a case where an electron beam is used as the excitation beam, provided that the magnetic material is one that contains iron as a main constituent element (for example, electrical steel sheet or permanent magnet), it is possible to observe the direction of magnetization or magnitude of magnetization at a depth of 0.1 μm or deeper (for example, about 2 μm). Furthermore, provided that the accelerating voltage of an electron beam used as the excitation beam is equivalent to the accelerating voltage (300 kV) of a normal TEM, it is possible to observe the direction of magnetization or magnitude of magnetization at a depth (for example, 1 μm or more, preferably 10 μm or more, for example about 20 μm) that is equivalent to that in the case where an X-ray is used as the excitation beam.

Also in the case where an electron beam is used as the excitation beam, even if the sample has the coating or film on its surface, it is possible to observe the direction of magnetization or magnitude of magnetization of a magnetic material present under the coating or film without having to remove the coating or film. In a case where the accelerating voltage of an electron beam used as the excitation beam is the same as the accelerating voltage of a normal SEM (30 kV), provided that the coating or film is made of an epoxy resin or aluminum, even if the coating or film has a practical thickness (for example, the coating or film has a thickness of about 5 μm to 10 μm), it is still possible to observe the direction of magnetization or magnitude of magnetization of a magnetic material present under the coating or film without having to remove the coating or film. In a case where the accelerating voltage of an electron beam used as the excitation beam is the same as accelerating voltage of a normal TEM (300 kV), provided that (1) the coating or film has a thickness of about 400 μm or less when the coating or film is made of an epoxy resin or (2) the coating or film has a thickness of about 100 μm or less when the coating or film is made of aluminum, even if the magnetic material has the coating or film thereon, it is still possible to observe the direction of magnetization or magnitude of magnetization of the magnetic material present under the coating or film without having to remove the coating or film.

Note that an electron beam can be easily concentrated to a small beam size. An electron beam having a small beam size is suitable for observation with high spatial resolution. Therefore, an electron beam is preferred as an excitation beam for observation of a fine magnetic domain structure (direction of magnetization or magnitude of magnetization in a minute region).

In a case where the excitation beam is an electron beam, an electron gun included in an electron microscope such as a transmission electron microscope (TEM) or an SEM can be used as an excitation beam source. With use of an electron beam concentrated to the SEM level (for example, 1 nm or more and 1 μm or less, typically 3 nm or more and 300 nm or less) as the excitation beam, it is possible to achieve a versatile observation. Alternatively, with use of an electron beam concentrated to the TEM level (for example, 0.3 nm or more and 30 nm or less) as the excitation beam, it is possible to achieve an observation with higher spatial resolution.

Alternatively, in a case where the excitation beam is a synchrotron X-ray, the excitation beam can be concentrated to a size of 50 μm or less (for example, about 10 μm). With use of a more advanced beam concentration technique, the excitation beam can be concentrated to a size of 1 μm or less (for example, about 200 nm to 300 nm). With the irradiation of a sample with such a concentrated beam (concentrated synchrotron X-ray), it is possible to achieve an observation with high spatial resolution.

There is no particular limitation on a size irradiated with the excitation beam. For example, the excitation beam may be concentrated to a diameter of about 0.1 nm or more and 1 mm or less (typically 1 nm or more and 100 μm or less) and the concentrated excitation beam may be applied to a sample.

Furthermore, by allowing the position irradiated with the excitation beam to sweep across a sample, it is possible to observe a magnetic domain structure. There is no particular limitation on a method of such sweeping. For example, the position irradiated with the excitation beam can be adjusted by moving an excitation beam source or by moving the sample.

The detecting step (S20) is a step of detecting the characteristic X-ray radiated from the sample in the irradiating step (S10). Typically, the step includes detecting circularly polarized components contained in the characteristic X-ray in distinction from each other by their direction of rotation. That is, a method capable of detecting a right-handed circularly polarized component and a left-handed circularly polarized component in distinction from each other can be suitably used as the method of detecting the characteristic X-ray.

The detecting step (S20) may include the following substeps in order to detect a right-handed circularly polarized component and a left-handed circularly polarized component in distinction from each other: a circularly polarized light separating substep (S21) including separating the right-handed circularly polarized component and the left-handed circularly polarized component; and an intensity detecting substep (S22) including detecting the intensities of the circularly polarized components (right-handed circularly polarized component and left-handed circularly polarized component) separated in the circularly polarized light separating substep (S21).

The circularly polarized light separating substep (S21) can include, for example: (1) a converting sub-sub step including converting one of the right-handed and left-handed circularly polarized components contained in the characteristic X-ray into a linearly polarized component having a first polarization direction, and converting the other of the right-handed and left-handed circularly polarized components into a linearly polarized component having a second polarization direction that is different from the first polarization direction and (2) an extracting sub-sub-step including extracting either the linearly polarized component having the first polarization direction or the linearly polarized component having the second polarization direction from the characteristic X-ray that contains both the linearly polarized component having the first polarization direction and the linearly polarized component having the second polarization direction obtained in the converting sub-sub-step. For example, in a case where (1) the right-handed circularly polarized component is converted into a linearly polarized component having a first polarization direction in the converting sub-sub-step and (2) the linearly polarized component having the first polarization direction is extracted in the extracting sub-sub-step, this circularly polarized light separating substep (S21) includes separating the right-handed circularly polarized component. Note that whether the right-handed circularly polarized component is separated or the left-handed circularly polarized component is separated in the circularly polarized light separating substep (S21) can be changed by, for example, either of the following two methods. The first method involves switching between (i) converting the right-handed circularly polarized component contained in the characteristic X-ray into a first linearly polarized component (in this case, the left-handed circularly polarized component is converted into a second linearly polarized component) in the converting sub-sub-step and (ii) converting the right-handed circularly polarized component contained in the characteristic X-ray into a second linearly polarized component (in this case, the left-handed circularly polarized component is converted into a first linearly polarized component) in the converting sub-sub-step. The second method involves switching between (i) extracting the first linearly polarized component from the characteristic X-ray in the extracting sub-sub-step and (ii) extracting the second linearly polarized component from the characteristic X-ray in the extracting sub-sub-step.

The converting sub-sub-step of the circularly polarized light separating substep (S21) can be carried out by, for example, using a wave plate such as a quarter-wave plate ($\lambda/4$ plate). Any known quarter-wave plate can be used as the quarter-wave plate without any particular limitation. The quarter-wave plate may be selected according to the wavelength of a characteristic X-ray. Examples include wave plates made of diamond single crystal, wave plates made of silicon (Si), and wave plates made of germanium (Ge). In particular, wave plates made of diamond single crystal (wave plates made of a light element material) are most suitable because of their low absorption of X-rays.

There is no particular limitation on a method of separating circularly polarized components using such a wave plate, and a known method may be employed. The following description will discuss an example of a suitable embodiment, based on an example case in which the wave plate is diamond single crystal.

First, a wave plate (diamond single crystal) is placed on the optical axis of a light-receiving optical system. In so doing, the orientation of the wave plate is set so that Bragg's condition is satisfied and that the wave plate causes Bragg reflection of a characteristic X-ray radiated from a sample. In the following description, the position of the wave plate in this state is referred to as a base position (0° position). Next, the wave plate is rotated about an axis orthogonal to the optical axis of the light-receiving optical system by a certain angle of rotation from the base position. This angle of rotation is determined so that the wave plate, after the rotation, functions as a +¼ wave plate. That is, the angle of rotation is determined so that the wave plate, after the rotation, converts a right-handed circularly polarized component into vertically linearly polarized light and converts a left-handed circularly polarized component into horizontally linearly polarized light. In the following description, this angle of rotation is referred to as "A°", and the position of the wave plate after rotation by A° is referred to as "+A° position".

Note that the "vertical" and "horizontal", each representing a polarization direction of linearly polarized light, indicate two axes (X axis and Y axis) appropriately set in a plane that is orthogonal to the optical axis of the light-receiving optical system. The X axis and the Y axis are orthogonal to each other in the plane. The following description is based on the assumption that the "horizontal" means the X axis and the "vertical" means the Y axis.

On the other hand, in a case where the wave plate (diamond single crystal) is rotated about the axis orthogonal to the optical axis of the light-receiving optical system from the 0° position by an angle A° in the opposite direction to the foregoing case where the wave plate is used as a +¼ wave plate (the position after rotation by an angle A° in the opposite direction is herein referred to as "−A° position"), the wave plate converts the right-handed circularly polarized component into horizontally linearly polarized light and converts the left-handed circularly polarized component into vertically linearly polarized light. In other words, the circularly polarized components before passing through the quarter-wave plate, having different directions of rotation, become linearly polarized components which are 90 degrees different in polarization direction. That is, the linearly polarized light obtained when the right-handed circularly polarized component has passed through the wave plate, and the linearly polarized light obtained when the left-handed circularly polarized component has passed through the wave plate, have orthogonal polarization directions.

As such, the diamond single crystal functions as a quarter-wave plate (λ/4 plate). That is, by changing the position of the wave plate and/or a polarizer (described later) (for example, by switching the position of the wave plate between the +A° position or the −A° position), it is possible to distinguish the circularly polarized components contained in the characteristic X-ray from each other by their direction of rotation.

Note, here, that the axis about which the wave plate is rotated is not particularly limited, provided that the axis is orthogonal to the direction of travel of the characteristic X-ray. The axis about which the wave plate is rotated is preferably set so as to coincide with a direction at an angle of 45° to the vertical and horizontal axes of the polarizer (analyzer) (described later).

Furthermore, the angle of rotation (A°) of the wave plate may be selected appropriately. For example, when the wave plate is rotated (changed in position) by about A°=0.010, the wave plate can function as a quarter-wave plate. The angle of rotation may therefore be selected appropriately from the range of, for example, 0<A°≤90°.

The extracting sub-sub-step of the circularly polarized light separating substep (S21) can be carried out by, for example, using a linear polarizer (analyzer). A known linear polarizer can be used as the linear polarizer without any particular limitation. The linear polarizer may be selected appropriately according to the wavelength of a characteristic X-ray. Examples of a linear polarizer usable in the extracting sub-sub-step include linear polarizers made of silicon and linear polarizers made of germanium.

There is no particular limitation on a method of extracting a linearly polarized component using such a linear polarizer, and a known method may be employed. The following description will discuss an example thereof, based on an example case in which germanium single crystal is used as the linear polarizer.

First, a linear polarizer is placed on the optical axis of a light-receiving optical system. In so doing, the orientation of the linear polarizer is set so that Bragg's condition is satisfied and that the linear polarizer causes Bragg reflection of a characteristic X-ray that has passed through the wave plate. The angle of the Bragg reflection (the angle between the reflective surface of the linear polarizer and the optical axis of the light-receiving optical system) is preferably close to 45°, preferably 450±5°, more preferably within the range of 45°±3°. A single crystal that causes such Bragg reflection is selected according to the energy of the characteristic X-ray. The single crystal, in this state, functions as a so-called linear polarizer, which selectively causes Bragg reflection of linearly polarized light having a polarization direction parallel to the axis about which the linear polarizer is rotated (i.e., having a vertical polarization direction), in distinction from linearly polarized light having a polarization direction perpendicular to the axis about which the linear polarizer is rotated (i.e., having a horizontal polarization direction). As such, it is possible to distinguish the linearly polarized components contained in the characteristic X-ray from each other by the direction (vertical or horizontal) relative to the axis about which the linear polarizer is rotated.

The characteristic X-ray, in practice, contains a plurality of kinds of characteristic X-ray corresponding to different elements and corresponding to different de-excitation processes (e.g., Kα emission, Kβ emission, Lα emission). Therefore, the spectrum of the characteristic X-ray has a plurality of peaks. That is, a characteristic X-ray emitted from a sample S is not monochromatic light.

Therefore, it is preferable that the polarizer selectively detects an X-ray within a specific energy band. That is, it is preferable that the polarizer also carries out energy resolving of the characteristic X-ray (detection of energy of X-ray).

For example, by appropriately configuring the polarizer, it is possible for an X-ray detector (described later) to detect a characteristic X-ray belonging to a narrow energy band corresponding to a specific characteristic X-ray (e.g., Kαi emission emitted from Fe).

With regard to the polarizer, a polarizer that can achieve a desired effect, such as the effect of selecting a polarization direction or selecting an energy band, may be employed appropriately. For example, in a case where the sample observed is iron (Fe), a polarizer composed of Ge single crystal can be suitably used.

Usually, the characteristic X-ray contains non-circular polarized components such as linearly polarized light, in addition to the circularly polarized light. Detection of a right-handed circularly polarized component and a left-handed circularly polarized component in distinction from each other does not necessarily mean that only the right-handed circularly polarized component or only the left-handed circularly polarized component is detected from the characteristic X-ray. Specifically, when one of the circularly polarized components is detected, a non-circular polarized component may be detected together, provided that, when the one of the circularly polarized components is detected, the other of the circularly polarized components is not detected together. For example, in a case where the circularly polarized components are detected by switching the position of the quarter-wave plate between different positions, a non-circular polarized component is contained in equal amounts both in cases where the right-handed circularly polarized component is detected and where the left-handed circularly polarized component is detected.

The circularly polarized light separating substep (S21) may further include a means to make the direction of travel of the characteristic X-ray uniform. Usually, the characteristic X-ray resulting from an excitation beam travels (radiates) radially, and therefore the characteristic X-ray is not parallel light. On the contrary, for separation of circularly polarized light, it is preferable to use parallel light. Therefore, it is preferable that, before the separation of circularly polarized light, parallelization (collimation) is carried out appropriately to render the characteristic X-ray parallel. It is therefore preferable that a collimating optical system, for rendering the characteristic X-ray parallel, is provided upstream of the foregoing circularly polarized light separating means (e.g., wave plate).

The intensity detecting substep (S22) is a step of detecting the intensity of each circularly polarized component contained in the characteristic X-ray. For example, the frequency of detection of photons constituting a circularly polarized component per unit time may be evaluated as the intensity of that circularly polarized component. For example, the proportions of the right-handed circularly polarized component and the left-handed circularly polarized component contained in the characteristic X-ray can each be detected as an indicator of the intensity of each circularly polarized component.

For example, it is only necessary to detect, with use of a known X-ray detector(s), each of the separated components of the characteristic X-ray separated by the direction of rotation of circular polarization in the circularly polarized light separating substep (S21). For example, similarly to a technique disclosed in Patent Literature 1, a semiconductor detector (e.g., silicon drift detector) that is capable of detecting an X-ray of such energy, i.e., the foregoing specific characteristic X-ray, with high sensitivity can be used.

It is known that the energy of a characteristic X-ray varies depending on what element is included in a magnetic material. For example, the following kinds of characteristic X-ray having different peak energies are emitted: in a case where a magnetic element is Fe, $FeK\alpha_1$ emission (peak energy=6.404 keV) is emitted; in a case of Co, $CoK\alpha_1$ emission (peak energy=6.930 keV) is emitted; in a case of Ni, $NiK\alpha_1$ emission (peak energy=7.478 keV) is emitted; and, in a case of Mn, $MnK\alpha_1$ emission (peak energy=5.899 keV) is emitted. FIG. 4 shows that, in two energy regions between which a peak energy (6.404 keV in FIG. 4) of such a characteristic X-ray is present, there is a significant difference between the intensities of the right-handed circularly polarized component and the left-handed circularly polarized component ($I^+$ and $I^-$ in FIG. 4), and the magnitude relationship between the $I^+$ and $I^-$ reverses at a central energy. Such a relationship also reverses when the direction of an applied magnetic field (direction of magnetization) is reversed. Therefore, by measuring the intensity ($I^+$) of the right-handed circularly polarized component and the intensity ($I^-$) of the left-handed circularly polarized component at a certain point in energy (e.g., 6.405 keV) which is near the central energy but is not the central energy, it is possible to observe the direction of magnetization within a sample.

Note that, in this specification, the term "central energy" refers to an energy at which the magnitude relationship between the intensity ($I^+$) of the right-handed circularly polarized component and the intensity ($I^-$) of the left-handed circularly polarized component reverses. For example, in a case where the characteristic X-ray is K$\alpha$1 emission, the magnitude relationship between the intensity ($I^+$) of the right-handed circularly polarized component and the intensity ($I^-$) of the left-handed circularly polarized component reverses at the peak energy of each of the foregoing characteristic X-rays. Therefore, in this case, the peak energy of each characteristic X-ray may be regarded as a central energy (typically, a certain energy falling within the range of "peak energy of characteristic X-ray±0.002 keV").

The calculating step (S30) includes comparing the intensity of the right-handed circularly polarized component and the intensity of the left-handed circularly polarized component detected in the detecting step (S20). Typically, the calculating step (S30) includes calculating the difference between the intensity of the right-handed circularly polarized component and the intensity of the left-handed circularly polarized component. The sign of the difference represents the direction of magnetization. Therefore, calculating such a difference corresponds to determining the direction of magnetization. Furthermore, the magnitude of the difference is correlated to the magnitude of magnetization. Therefore, calculating such a difference leads to determining the magnitude of magnetization.

In a preferred aspect, the difference between the intensity ($I^+$) of the right-handed circularly polarized component and the intensity ($I^-$) of the left-handed circularly polarized component (such a difference is "$I^+-I^-$") is normalized. For example, the difference ($I^+-I^-$) is divided by the sum ($I^++I^-$) of the intensities of the detected circularly polarized components to find an "flipping ratio". Based on the sign of this flipping ratio, it is possible to determine the direction of magnetization. Also, based on the absolute value of the flipping ratio, it is possible to determine the magnitude of magnetization. A method of normalization is not particularly limited, and any method may be selected as appropriate. Specifically, not only the foregoing difference $I^+-I^-$, ratio ($I^+-I^-$)/($I^++I^-$) and the like, but also any amount that represents the difference between $I^+$ and $I^-$ with high S/N ratio can be used appropriately.

The flipping ratio is suitable as an indicator for use in observation of magnetic domains, because the above difference is enhanced and the direction of rotation of circularly polarized light can be easily recognized.

The intensity of a characteristic X-ray may change due to the surface profile (typically, surface irregularities) of a sample. Therefore, the surface profile of the sample may influence the absolute value of the difference between the intensity of the right-handed circularly polarized component and the intensity of the left-handed circularly polarized component, and may result in a reduction in accuracy of magnetic domain structure observation. On the contrary, the flipping ratio is less prone to the effects of the surface profile of the sample than the difference as-is. Therefore, with use of the flipping ratio as an indicator in observation of a magnetic domain structure, it is possible to improve the accuracy of magnetic domain structure observation.

In a case where a characteristic X-ray is detected only from a single direction, obtained information corresponds to the direction and magnitude of a component which is a projection of magnetization (vector) along a direction of a light receiving axis. Therefore, in a case where the direction of magnetization is observed as a vector, it is necessary to use measurement systems which differ in direction of the light receiving axis to detect a characteristic X-ray from a sample and thereby individually measure the components which are projections of a magnetization vector along directions of respective light receiving axes. Even in such cases, with use of the flipping ratio, it is possible to directly compare the measured values corresponding to the respective light receiving axes without having to correct the detection results for each light receiving axis. The use of the flipping ratio is therefore preferred.

The sign and absolute value of the difference between the intensity of the right-handed circularly polarized component and the intensity of the left-handed circularly polarized component correspond to the direction and magnitude of a component which is a projection of magnetization (vector) along the direction of the light receiving axis. Therefore, by detecting the characteristic X-ray from a plurality of different directions, it is also possible to recognize magnetization as a vector.

Specifically, by arranging a plurality of detectors so as to detect the characteristic X-ray from different detection directions and comparing the flipping ratios calculated based on the results detected on the respective detectors with each other, the magnetization can be measured as a vector. For example, by arranging two detectors such that the directions of detection of the characteristic X-ray are different by 90° and observing a sample with use of the detectors, in-plane magnetization (magnetization in a flat plane) can be measured as a two-dimensional vector. Alternatively, by arranging three detectors such that the directions of detection of the characteristic X-ray are three orthogonal different directions and observing a sample with use of the detectors, magnetization can be measured as a three-dimensional vector.

For example, magnetization can be measured as a two-dimensional or three-dimensional vector by, with use of a measurement apparatus that can be changed in direction of the light receiving axis, sequentially measuring the characteristic X-ray from a plurality of different directions. The characteristic X-ray can be sequentially measured from a plurality of different directions also by changing the direction of a sample relative to the light receiving axis by, for example, rotating a sample stage. In such arrangements, mapping of vectors can also be achieved by: carrying out sweeping in each of the measurements from a plurality of directions independently of each other; subjecting the obtained results to image recognition to derive pieces of data of identical position on the sample; and superimposing these pieces of data with each other.

On the other hand, in cases of permanent magnet materials, grain-oriented electrical steel sheets, magnetic memory materials, or the like, the direction of magnetization is fixed in many cases. In such cases, a single-direction detection only is sufficient to measure the direction and magnitude of the magnetization, in many cases.

[Magnetic Material Observation Apparatus]

The following description will discuss a magnetic material observation apparatus in accordance with an embodiment of the present invention. FIG. 1 illustrates a configuration of this magnetic material observation apparatus 1. In this configuration, the direction of magnetization or magnitude of magnetization at a point on a surface of a sample S (top surface in FIG. 1) is recognized. Alternatively, the direction of magnetization or magnitude of magnetization within the sample S can be recognized. This makes it possible to recognize a distribution of regions in each of which the magnetization is in a uniform direction (magnetic domains).

The magnetic material observation apparatus 1 is partially equal in configuration to a known scanning electron microscope. First, in FIG. 1, the magnetic material observation apparatus 1 includes an electron source (electron gun) 11 at the topmost part thereof. The electron source 11 emits an electron beam (excitation beam) E1 in a downward direction in FIG. 1. An electron optical system 12 includes a coil and/or an electrode arranged to shape the electron beam E1 so that the energy, beam size, beam profile, and intensity of the electron beam E1 will be appropriate on the sample S fixed on a sample stage 13. The electron optical system 12 may also include a deflecting coil for sweeping the electron beam E1 across the sample S. In this case, the direction of travel of the electron beam E1 can be changed so that the surface of the sample S is scanned two-dimensionally or the inside of the sample S is scanned three-dimensionally. That is, the electron source 11 and the electron optical system 12 function as an excitation beam source 10 for scanning the electron beam (excitation beam) E1 across the sample S.

There is provided an electron detector 20 on the top surface side of the sample S. The electron detector 20 detects a secondary electron E2 that is generated upon irradiation of the surface of the sample S with the electron beam E1. Note that electrons detected by the electron detector 20 can contain backscattered electrons and the like, in addition to the secondary electron E2. A control section 21 controls the above configuration, and functions also as a data processing section to control a display section (display) 22 to display a two-dimensional image of the intensity detected on the electron detector 20 obtained by sweeping the electron beam E1. In this two-dimensional image, the intensity detected on the electron detector 20 is displayed in a manner such that, for example, the intensity corresponds to the position of the sample S irradiated with the electron beam E1. This two-dimensional image is an electron beam image of the surface of the sample S. The configuration as has been discussed is the same as that of a known scanning electron microscope (SEM). Therefore, the magnetic material observation apparatus 1 functions also as a normal scanning electron microscope. Note that, instead of sweeping the electron beam E1 across the fixed sample S, the electron beam E1 may be fixed and the sample S may be moved in in-plane directions.

The magnetic material observation apparatus 1 discussed herein includes, in addition to the above configuration to measure secondary electrons and backscattered electrons, also a configuration to measure a characteristic X-ray emitted from an element included in a magnetic material irradiated with the electron beam E1, on the surface of the sample S. Examples of the element include magnetic elements such as Fe, Co, Ni, Mn, Nd, Sm, Gd, Tb, and Dy. The energies of characteristic X-rays emitted from these elements are well-known. For example, in the following example, $K\alpha_1$ emission (6.404 keV) emitted from Fe, which is a magnetic material element, is used as the characteristic X-ray. As disclosed in Patent Literature 1, also in a known X-ray microanalyzer, chemical composition analysis of the sample is carried out by recognizing a characteristic X-ray in a spectrum of an X-ray emitted from a sample and thereby identifying the element that emitted the characteristic X-ray. In contrast, the magnetic material observation apparatus 1 measures each of the intensities of a right-handed circularly polarized component and a left-handed circularly polarized component contained in the characteristic X-ray, and is thereby capable of obtaining information on magnetization.

Therefore, in this arrangement, there is provided a detecting section 30 for detecting each of the intensities of the right-handed circularly polarized component and the left-handed circularly polarized component of the characteristic X-ray. In the detecting section 30, a collimating optical system 31 is used first to make, into parallel light, an X-ray X1 (collimate an X-ray X1) that is emitted in a diverging manner from a portion of the sample S irradiated with the electron beam E1. The X-ray X1, in practice, contains, for example, a plurality of kinds of characteristic X-ray corresponding to different elements and corresponding to different de-excitation processes (such as $K\alpha$ emission, $K\beta$ emission, $L\alpha$ emission) and continuous X-rays which are not characteristic X-rays, and therefore has a plurality of peaks in a spectrum thereof. Then, the X-ray X1 passes through a wave plate 32 that corresponds to the energy of the characteristic X-ray measured. The wave plate 32 is a quarter-wave plate ($\lambda/4$ plate) corresponding to the energy (wavelength) of the characteristic X-ray measured. Furthermore, the position (angle) of the wave plate 32, around an axis orthogonal to the optical axis of the light-receiving optical system, can be switched between two angles (described later) by the control section 21.

As described earlier, each of the circularly polarized components, after passing through the wave plate 32, is linearly polarized light polarized in a certain direction. Specifically, the polarization direction of the linearly polarized light, obtained after passing through the wave plate 32, differs by 90° depending on the direction of rotation (right-handed, left-handed) of the circularly polarized component before passing through the wave plate 32. In other words, each circularly polarized component, after passing through the wave plate 32, is vertically linearly polarized light or horizontally linearly polarized light. Assuming that the characteristic X-ray is $K\alpha_1$ emission (6.404 keV) emitted from Fe (described later), the wave plate 32, serving as a $\lambda/4$ plate, can be constituted by, for example, diamond and/or the like.

An X-ray X2, which has passed through the wave plate 32, is reflected at a reflective polarizer 33 that selectively causes Bragg reflection of only a component having a specific polarization direction, and becomes an X-ray X3.

The X-ray X3 is detected at an X-ray detector 34, and outputted as an electric signal. The polarizer 33 is constituted by, for example, a Ge single crystal, and selectively only diffracts an X-ray having a specific energy within a narrow band, in addition to a component having the foregoing specific polarization direction. Therefore, although the X-ray X1 emitted from the sample S is not monochromatic light as described earlier, the X-ray X1 can be detected by the X-ray detector 34 as the X-ray X3 having a narrow energy band corresponding to a specific characteristic X-ray (for example, $K\alpha_1$ emissions emitted from Fe), depending on the configuration of the polarizer 33. The X-ray detector 34 used here can be a semiconductor detector (e.g., silicon drift detector) that is capable of detecting an X-ray of this energy with high sensitivity, similarly to the technique disclosed in Patent Literature 1.

Assume here that, for example, the position of the wave plate 32 is set so that the left-handed circularly polarized component contained in the characteristic X-ray, after passing through the wave plate 32, has a polarization direction that is equal to the direction selectively diffracted (Bragg reflection) at the polarizer 33 (for example, the wave plate 32 is placed in the foregoing position $-A°$). In this case, the left-handed circularly polarized component contained in the characteristic X-ray is detected at the X-ray detector 34. In this case, the polarization direction of the right-handed circularly polarized component contained in the characteristic X-ray, after passing through the wave plate 32, is orthogonal to the polarization direction of the left-handed circularly polarized component contained in the characteristic X-ray after passing through the wave plate 32. Therefore, in this case, the right-handed circularly polarized component contained in the characteristic X-ray is not detected at the X-ray detector 34. On the contrary, in a case where the wave plate 32 is rotated (for example, the wave plate is placed in the foregoing position $+A°$), the polarization direction of the characteristic X-ray passing through the wave plate 32 changes by 90°. Therefore, contrary to the above case, the right-handed circularly polarized component is detected at the X-ray detector 34 and the left-handed circularly polarized component is not detected at the X-ray detector 34. Note that, provided that the intensity of each of the right-handed and left-handed circularly polarized components of the characteristic X-ray can be obtained at the X-ray detector 34 in a similar manner, the position (position around the axis orthogonal to the optical axis) of the wave plate 32 is set appropriately.

Therefore, the control section 21 is capable of recognizing the intensity of each of the right-handed and left-handed circularly polarized components of the characteristic X-ray by, when the X-ray X1 is emitted, switching the position of the wave plate 32 between two positions around the axis orthogonal to the optical axis and thereby obtaining output of the detector 34. Note, here, that the difference between the intensities of the right-handed and left-handed circularly polarized components of the characteristic X-ray, that is, the difference between the intensity of the right-handed circularly polarized component and the intensity of the left-handed circularly polarized component, represents the direction of magnetization or magnitude of magnetization on the surface or inside of the sample S, as described below.

The following description will discuss the results obtained by actually analyzing the relationship between (i) how a characteristic X-ray emitted from a magnetic material (Fe) is polarized and (ii) the direction of magnetization and magnitude of magnetization. It is well known that the absorption coefficient of a circularly polarized X-ray for a ferromagnetic material varies depending on the direction of magnetization, as X-ray magnetic circular dichroism (XMCD). In contrast, the present invention utilizes the fact that a characteristic X-ray itself emitted from an Fe atom contains a circularly polarized component and that the proportion of a component in each rotation direction (each of the right-handed and left-handed circularly polarized components) contained in the circularly polarized component relative to the circularly polarized component varies depending on magnetization.

Figure 2:
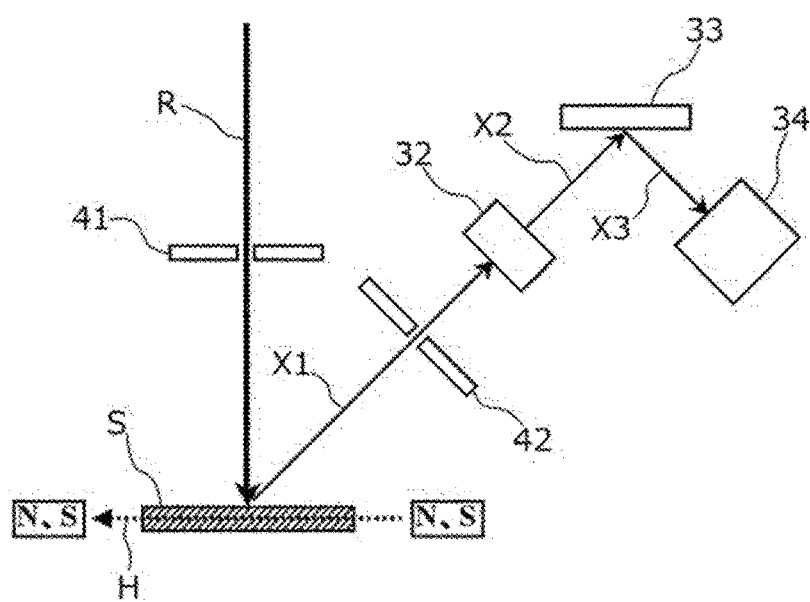
FIG. 2 illustrates a configuration used in an experiment for checking a relationship between magnetization and directions of rotation of circularly polarized components of a characteristic X-ray.

Using a sheet made of Fe as a sample S, magnetization and the characteristics of the circularly polarized components of the characteristic X-ray were analyzed. FIG. 2 illustrates a configuration used in this measurement. The configuration illustrated in FIG. 1 is based on the assumption that the excitation beam for allowing a magnetic element of a sample S to radiate the characteristic X-ray is the electron beam E1; however, in FIG. 2, high-intensity, monochromatic (7.13 keV) synchrotron X-ray radiation (X-ray synchrotron R) was used instead. Furthermore, an external magnetic field H, which is intense to the extent that the magnetization of the sample S can be saturated, was applied in an in-plane direction on the main face of the sample S such that the direction of the magnetic field H can be reversed. The synchrotron X-ray R having passed through a slit 41 was incident on the sample S in a direction perpendicular to the main face of the sample S. As a result, an X-ray X1, which was radiated from the sample S at an angle of emission of 45° in a plane parallel to the direction of magnetization (external magnetic field H) and the direction of the synchrotron X-ray S, was detected via a slit 42 using the wave plate 32, the polarizer 33, and the X-ray detector 34 which are the same as those described earlier. Note that, although the angle of emission of the characteristic X-ray (X-ray X1) is 45° in Embodiment 1, the angle of emission is not limited as such. Furthermore, although the observation here was carried out without use of the collimating optical system 31, the collimating optical system 31 may be placed upstream of the wave plate 32 also in a case where the synchrotron X-ray is used as the excitation beam, similarly to the case where the electron beam is used as the excitation beam.

FIG. 3 shows the results of detection (energy spectra) at the X-ray detector 34 obtained by switching the state of the wave plate 32 between two states as described earlier. The characteristic X-ray detected here corresponds to Kai emission emitted from Fe. When the outputs of the above two states are mixed (in a case where the X-ray detector 34 carries out detection without distinction between polarization states), a peak appears at 6.404 keV. In FIG. 3, the outputs (number of counts per 600 seconds) of the X-ray detector 34 in the respective two states are represented by intensities $I^+$ (open circles in FIG. 3) and intensities $I^-$ (filled circles in FIG. 3) with error bars, respectively. As described earlier, the intensities $I^+$ and $I^-$ correspond to the intensities of circularly polarized components rotated in opposite directions. Note, however, that the characteristic X-ray radiated from the sample S contains also a lot of non-circular polarized components other than the circularly polarized components. Therefore, the intensities $I^+$ and $I^-$ each indicate the sum of the intensity of a circularly polarized component and the intensity of a non-circular polarized component that cannot be discriminated by the wave plate 32, polarizer 33, and the like. Note that the intensity of a non-circular polarized component counted as the intensity $I^+$ and the intensity of a non-circular polarized component counted as the intensity $I^-$ are each half the intensity of the non-circular polarized component contained in the characteristic X-ray.

The characteristics shown in FIG. 3 show that the difference between the intensities $I^+$ and $I^-$ is significant at and around the peak of the $K\alpha_1$ emission emitted from Fe, i.e., at and around 6.404 keV. Such a difference represents the difference between the intensity of the right-handed circularly polarized component and the intensity of the left-handed circularly polarized component contained in the characteristic X-ray ($K\alpha_1$ emission emitted from Fe). By reversing the direction of the external magnetic field H applied, it is possible to reverse the direction of magnetization of the sample S. FIG. 4 is a chart obtained by plotting the ratios "$(I^+-I^-)/(I^++I^-)$" before and after the reverse of the direction of the external magnetic field H, respectively. The states of the sample S before and after the reverse of the external magnetic field H correspond, respectively, to (i) a state in which horizontal magnetization is in a uniform first direction in all magnetic domains of the sample S and (ii) a state in which horizontal magnetization is in a uniform second direction (opposite to the first direction) in all the magnetic domains of the sample S. The difference "$I^+-I^-$" corresponds to the difference between the outputs of the detector 34 obtained when the wave plate 32 is in respective two states. In FIG. 4, the results obtained before the reverse of direction of the external magnetic field H are represented by +H (filled circles), and the results obtained after the reserve of direction of the external magnetic field H are represented by −H (open circles), respectively, with error bars. The curve in FIG. 4 is an approximated curve as an eye guide. Note that the normalization factor used here was $[(I^+)+(I^-)]$ peak (the largest of the sums of the intensities represented by filled circles and the intensities represented by open circles at respective points in energy in FIG. 3 was used), instead of the $(I^++I^-)$.

FIG. 4 shows that there is a significant difference between the intensities $I^+$ and $I^-$ in two energy regions between which the central energy (6.404 keV) is present, and that the magnitude relationship between the intensities $I^+$ and $I^-$ reverses at the central energy. Such a relationship also reverses when the direction of the external magnetic field H is reversed and thereby the direction of magnetization of the sample S reverses. Therefore, by measuring the intensities of $I^+$ and $I^-$ at a certain point in energy (e.g., 6.405 keV) which is near the central energy but is not the central energy, it is possible to recognize the direction of magnetization at least in a direction parallel to the main face of the sample S (the direction in which the magnetic field is applied). Alternatively, with use of an integral value of the difference "$I^+-I^-$" in a lower energy region than the central energy and an integral value of the difference "$I^+-I^-$" in a higher energy region than the central energy, it is possible to carry out the above recognition with lesser errors. Furthermore, the absolute values of the difference "$I^+-I^-$", the ratio "$(I^+-I^-)/(I^++I^-)$", the foregoing integral values of the difference "$I^+-I^-$", and the like each correspond to the magnitude of magnetization of the sample S, and each become zero when the magnetization is zero. More specifically, it is possible to obtain information corresponding to the direction and magnitude of a component, of the magnetization, which is a projection along the direction of the light receiving axis.

Figure 5:
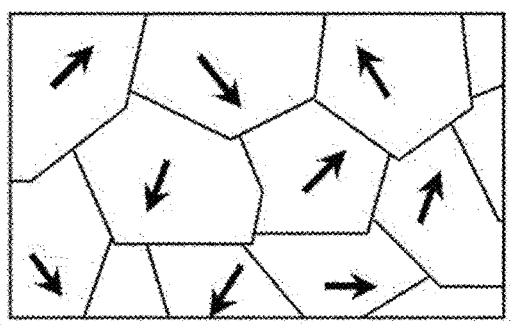
FIG. 5 schematically illustrates a magnetic domain structure on a sample.

In FIGS. 3 and 4, measurements were carried out under the circumstances in which an intense external magnetic field H is applied and thereby magnetization is saturated, and the direction of magnetization and magnitude of magnetization are uniform in the sample S. However, according to the magnetic material observation apparatus 1, it is also possible to observe a distribution of directions of magnetization or magnitudes of magnetization also with regard to the sample S which is not having an intense external magnetic field H applied thereto, i.e., the sample S in which magnetization is not in a uniform direction. FIG. 5 schematically illustrates a structure of magnetic domains of a magnetic material when no external magnetic field H is applied. The direction and length of each arrow in FIG. 5 represent the direction of magnetization and magnitude of magnetization, respectively. In such a circumstance, (1) the direction of magnetization or magnitude of magnetization differs from one magnetic domain to another, (2) magnetization is uniform in each magnetic domain, and (3) the direction of magnetization or magnitude of magnetization abruptly changes at a border (magnetic domain wall) between magnetic domains. Therefore, in a case where the same results of measurement as those of FIGS. 3 and 4 are obtained at respective points on the sample S, the calculated value of the foregoing difference "$I^+-I^-$" or the like is uniform within a single magnetic domain and abruptly changes at a border between magnetic domains. Note that, by an observation with high spatial resolution, it is also possible to obtain information on a distribution of directions and magnitudes of magnetization within a border area (magnetic wall) between magnetic domains.

Therefore, by sweeping the synchrotron X-ray R (used as the excitation beam) in FIG. 2 and calculating the values such as the differences "$I^+-I^-$" and the ratios "$(I^+-I^-)/(I^++I^-)$" corresponding to respective irradiated positions on the sample S, it is possible to obtain a distribution of directions of magnetization or magnitudes of magnetization of that sample. Furthermore, by causing the display section 22 to two-dimensionally display a two-dimensional image constituted by pixels each corresponding to an irradiated position on the sample S and in which the pixel value (gray level or color) of each pixel corresponds to the value of the difference "$I^+-I^-$", the ratio "$(I^+-I^-)/(I^++I^-)$" or the like obtained when the position corresponding to that pixel is irradiated with the excitation beam, it is possible to display the magnetic domain structure as illustrated in FIG. 5 in a visible manner.

In the examples shown in FIGS. 3 and 4, the synchrotron X-ray R is used as the excitation beam; however, also in a case where the electron beam E1 is used as in the configuration illustrated in FIG. 1, the same principle applies. In this case, as compared to the case where the foregoing synchrotron X-ray R is used, the excitation beam source 10 and this magnetic material observation apparatus 1 can be further reduced in size and price. Furthermore, use of the collimating optical system 31 makes it possible to increase the detection intensity at the detector 34, and thus possible to efficiently obtain the intensities $I^+$ and $I^-$. This makes it possible for the display section 22 to display a magnetic domain structure as described earlier. That is, a magnetic material observation method carried out using the magnetic material observation apparatus 1 configured as illustrated in FIG. 1 involves carrying out the irradiating step (i.e., the step of irradiating a region of a sample S with an electron beam E1) and carrying out the detecting step (i.e., the step of recognizing, as intensities of two circularly polarized components in different rotation directions, of an X-ray corresponding to a characteristic X-ray emitted upon irradiation of the sample S with the electron beam E1). These steps are repeated two or more times, while sweeping the electron beam E1 such that the above region moves across the sample S. The method involves carrying out a displaying step (i.e., the step of causing, as described earlier, the display section 22 to display an image obtained by conversion of each value calculated from the difference between the two intensities recognized in the detecting step) after the detecting step.

The configuration illustrated in FIG. 1 functions also as a scanning electron microscope as described earlier, and therefore it is also possible to cause the display section 22 to display a normal electron beam image of the sample S. In so doing, it is possible to cause the display section 22 to display an image of a magnetic domain structure based on the foregoing intensities $I^+$ and $I^-$ together with the electron beam image. This makes it easy to recognize the magnetic domain structure corresponding to, for example, a microstructure on the surface of the sample S. That is, an image acquiring section to acquire a scanning electron microscope image (microscope image) may further be provided, and an image in which the microscope image and a region irradiated with the electron beam, which are displayed such that the microscope image and the region correspond to each other, may be outputted. Similarly, the configuration illustrated in FIG. 1 can alternatively include a configuration of a transmission electron microscope.

Generally, the surface of a sample made of a magnetic material has a film such as a natural oxide film formed thereon in many cases. Conventional methods of observing a magnetic domain structure are difficult to carry out measurement in the presence of the film, and thus necessitate pre-treating the sample and thereby eliminating the film.

When an X-ray is used as an excitation beam, it is possible to cause the excitation beam to reach a magnetic material present under the film. Furthermore, in a case where an electron beam E1 is used, despite that the penetrability through substances is lower than when synchrotron X-ray R having equivalent energy is used, the energy of the electron beam E1 can easily be increased to an energy that is enough to penetrate the film on the surface of the sample S, with use of the electron optical system 12. Specifically, by increasing the energy of the electron beam E1 with use of the electron optical system 12 illustrated in FIG. 1, it is possible to cause the electron beam E1 to penetrate such a film or to reach a predetermined depth of 1 μm or deeper (for example, 5 μm or deeper, preferably 10 μm or deeper) of the sample S.

Furthermore, what is directly measured in the above configuration is the characteristic X-ray, and the energy of the characteristic X-ray is, as described earlier, 6.404 keV, for example, in a case of FeK$\alpha_1$. Such an X-ray in a hard energy region is highly penetrable through substances. It is therefore possible to detect a characteristic X-ray emitted from a region at a depth of about several micrometers or more from the surface of the sample. Furthermore, the characteristic X-ray is highly penetrable through a coating or film made of a non-magnetic material. Therefore, even if such a coating or film is present on the sample S, the coating or film does not greatly affect the measurement of intensities $I^+$ and $I^-$ and the like. That is, the configuration disclosed herein not only eliminates the need for a pre-treatment to remove the coating or film made of a non-magnetic material from the surface of the sample but also makes it possible to carry out measurement of a magnetic domain structure at a deep depth. For example, it is possible to measure a magnetic domain structure at a depth that is 1000 times or deeper than those achieved when the foregoing spin-SEM is used.

Furthermore, the configuration illustrated in FIG. 1 is different from a usual scanning electron microscope mainly in that the configuration of FIG. 1 further includes the detecting section 30. The control section 21 is different from that of a usual scanning electron microscope only in that the control section 21 is provided with an additional function as the data processing section as described earlier. Therefore, the magnetic material observation apparatus 1 can be obtained substantially by adding the detecting section 30 to a conventional scanning electron microscope. That is, the configuration of the magnetic material observation apparatus 1 can be simple. Note, here, that the configuration of the detecting section 30, which includes the collimating optical system 31, the wave plate 32, the polarizer 33, and the X-ray detector 34, is simple. Note that the collimating optical system 31 is not essential, provided that the intensity of a characteristic X-ray detected is high enough. Also note that, in a case where an X-ray microanalyzer is included in a scanning electron microscope, the X-ray microanalyzer can also serve as the X-ray detector 34.

As described earlier, the magnetic material observation apparatus 1 needs only be capable of detecting the intensity of each circularly polarized component contained in a characteristic X-ray emitted from the sample S, and therefore does not necessitate making special processing on the sample S such as attaching some other member onto the sample S like the technique disclosed in Patent Literature 3. This is the same as a conventional X-ray microanalyzer and the like. Therefore, it is possible to easily observe a magnetic domain structure of the sample S.

Note that the descriptions so far discussed example configurations in which the electron beam E1 or synchrotron X-ray R (X-ray) is used as an excitation beam; however, some other excitation beam can be used, provided that it is possible to allow a characteristic X-ray to be radiated from a magnetic element included in the sample S. For example, an electromagnetic wave beam other than the X-ray or a charged particle beam other than the electron beam can be used as the excitation beam. Examples of an electromagnetic wave beam other than the X-ray, usable as the excitation beam, include gamma-ray. Examples of a charged particle beam other than the electron beam, usable as the excitation beam, include positron beam, proton beam, muon beam, and ion beam.

Note that, according to the technique disclosed herein, it is possible to carry out measurement at deep depths from which the characteristic X-ray can escape from a sample. Therefore, in a case of carrying out measurement at a deep depth of the sample S (in a case of carrying out measurement inside the sample), it is preferable that the energy of the excitation beam is set so that the depth of the sample S reached by the excitation beam (such a depth is "D1") is equal to or greater than the deepest depth from which the characteristic X-ray can escape from the sample (such a depth is "D2") (i.e., D1≥D2).

The descriptions so far discussed example configurations in which the characteristic X-ray measured is K$\alpha_1$ emission emitted from Fe; however, light emitted through some other de-excitation process (such as K$\alpha_2$ emission, Kβ emission, Lα emission) can be used, provided that the directions of rotation of circularly polarized components contained in the characteristic X-ray can be discriminated from each other and detected similarly to the above configurations. Examples of elements which emit such characteristic X-rays include, in addition to Fe, magnetic material elements such as Co, Ni, Mn, Nd, Sm, Gd, Tb, and Dy. Irrespective of which of the elements is employed for measurement, the characteristic X-ray emitted therefrom has an energy on the order of keV; therefore, such a characteristic X-ray is highly penetrable through substances as compared to secondary electrons measured in the foregoing spin-SEM, and the foregoing coating/film and the like do not greatly affect the measurement. Furthermore, in a case where the sample S is an alloy that contains any of the above elements, a certain kind of characteristic X-ray contained in the alloy can be selected appropriately as a target to be detected by the X-ray detector 34.

Note that, as described earlier, imaging of the values each calculated from the difference between intensities I$^+$ and I$^-$ makes it possible to recognize abrupt changes in magnetization at borders between magnetic domains, and thus possible to make fine magnetic domain structures visually perceptible. The values used here are not limited to the foregoing differences "I$^+$−I$^-$", the ratios "(I$^+$−I$^-$)/(I$^+$+I$^-$)", and the like, and can be some other appropriate amount that represents the difference between the intensities I$^+$ and I$^-$ with high S/N ratio.

The descriptions so far discussed example configurations in which the wave plate 32 and the polarizer 33 are used in combination in order to detect circularly polarized components, in respective rotation directions, contained in a characteristic X-ray. However, some other configuration can be employed, provided that circularly polarized components, in respective rotation directions, of a characteristic X-ray can be detected similarly to the above configurations. For example, the following configuration may be employed: a wave plate is used to obtain a characteristic X-ray that contains two kinds of linearly polarized component different in polarization direction; and the intensities for respective polarization directions can be detected at an X-ray detector without use of the polarizer 33.

In the examples described so far, the intensities I$^+$ and I$^-$ are used, which can be easily detected by the configuration illustrated in FIG. 1, because an objective of the examples is to make a magnetic domain structure visually perceptible. In this case, although a structure (distribution) of magnetic domains in FIG. 5 can be recognized, the magnitude and direction of magnetization as a vector in FIG. 5 are not accurately detected. However, when the position of the detecting section 30 in FIG. 1 (the orientation of the detecting section 30 relative to a position irradiated with electron beam E1) is configured to be changeable, magnetization as a vector can be measured more accurately. Alternatively, as described earlier, by employing a configuration in which the direction of the light receiving axis is changeable and carrying out measurement from a plurality of directions, it is also possible to measure the magnetization as a two- or three-dimensional vector. It is possible to carry out measurement from a plurality of directions also by changing the orientation of the sample relative to the light receiving axis by, for example, rotating the sample stage. In these arrangements, mapping of vectors can also be achieved by: carrying out sweeping in each of the measurements from a plurality of directions independently of each other; subjecting the obtained results to image recognition to derive pieces of data of identical position on the sample; and superimposing these pieces of data with each other.

[Supplemental Remarks Regarding Collimating Optical System]

Note that, in a case of a configuration in which, as illustrated in FIG. 2, a specific X-ray that is contained in a characteristic X-ray emitted from a sample S and that has passed through the slit 42 is incident on the X-ray detector 34, a portion that is contained in the characteristic X-ray emitted from the sample S and that does not pass through the slit 42 (typically, most part of the characteristic X-ray emitted from the sample S) is lost without reaching the X-ray detector 34. In contrast, in a case of a configuration in which, as illustrated in FIG. 1, a characteristic X-ray that is emitted from the sample S is collimated with use of the collimating optical system 31 and then incident on the X-ray detector 34, it is possible to allow the characteristic X-ray emitted from the sample S to enter the X-ray detector 34 in a much greater amount. As such, a configuration in which the characteristic X-ray emitted from the sample S is collimated with use of the collimating optical system 31 and then allowed to enter the X-ray detector 34 is advantageous in terms of the use efficiency of the characteristic X-ray emitted from the sample S.

It is preferable that the collimating optical system 31 is a collimating optical system that is capable of two-dimensionally collimating the characteristic X-ray emitted from the sample S. This is because, when the angle of acceptance of the characteristic X-ray emitted from the sample S (range of angles within which the ray, which can enter the X-ray detector 34, goes out of the collimating optical system 31) increases a times per dimension, the use efficiency of the characteristic X-ray emitted from the sample S increases $a^2$ times.

Such a collimating optical system can be comprised of, for example, a Montel multilayer mirror. Tests carried out by the inventors of the present invention confirmed that, when a collimating optical system comprised of a Montel multilayer mirror is used as the collimating optical system 31, the angle of acceptance of a characteristic X-ray emitted from a sample S increases about 170 times per dimension, and that the use efficiency (use efficiency taking into consideration the reflectivity, 75%, of the Montel multilayer mirror) of the characteristic X-ray emitted from the sample S increases about 20,000 times.

[Recap]

The present embodiment includes the following features in order to attain the foregoing object.

A magnetic material observation method in accordance with an embodiment is a method for observing a direction of magnetization or a magnitude of magnetization of a sample that contains a magnetic material, the method including: an irradiating step including irradiating a region of the sample with an excitation beam, the excitation beam being a beam that allows an element included in the magnetic material to radiate a characteristic X-ray upon irradiation of the sample with the beam; a detecting step including recognizing, as intensities of two circularly polarized components in respective rotation directions, the characteristic X-ray radiated from the element upon irradiation of the sample with the excitation beam; and a calculating step including calculating a difference between the intensities of the two circularly polarized components recognized in the detecting step.

A magnetic material observation method in accordance with an embodiment is arranged such that the excitation beam is an electromagnetic wave beam or a charged particle beam.

A magnetic material observation apparatus in accordance with an embodiment is an apparatus for observing a direction of magnetization or a magnitude of magnetization of a sample that contains a magnetic material, the magnetic material observation apparatus including: an excitation beam source configured to emit an excitation beam, the excitation beam being a beam that allows an element included in the magnetic material to radiate a characteristic X-ray upon irradiation of the sample with the beam; a detecting section configured to detect the characteristic X-ray, radiated by the element upon irradiation of the sample with the excitation beam, as circularly polarized components different in direction of rotation, the circularly polarized components being a right-handed circularly polarized component and a left-handed circularly polarized component; and a data processing section configured to carry out output of values each calculated from a difference between an intensity of the right-handed circularly polarized component and an intensity of the left-handed circularly polarized component.

A magnetic material observation apparatus in accordance with an embodiment is arranged such that: the excitation beam source is configured to irradiate the sample with the excitation beam such that a position, irradiated with the excitation beam, of the sample sweeps; and the data processing section is configured to (i) recognize the values as the position irradiated with the excitation beam sweeps and (ii) carries out output of an image in which the values correspond to regions, irradiated with the excitation beam, of the sample.

A magnetic material observation apparatus in accordance with an embodiment is arranged such that the magnetic material observation apparatus includes a quarter-wave plate for the characteristic X-ray.

A magnetic material observation apparatus in accordance with an embodiment is arranged such that the detecting section includes a polarizer configured to impart, to the characteristic X-ray that has passed through the quarter-wave plate and then changed to linearly polarized light, an intensity that differs according to a polarization direction.

A magnetic material observation apparatus in accordance with an embodiment is arranged such that the excitation beam is an electromagnetic wave beam or a charged particle beam.

A magnetic material observation apparatus in accordance with an embodiment is arranged such that the excitation beam is an electron beam, the magnetic material observation apparatus further including an image acquiring section configured to acquire a microscope image which is a scanning electron microscope image or a transmission electron microscope image, the data processing section being configured to carry out output of an image in which the microscope image and a region irradiated with the excitation beam are displayed such that the microscope image and the region correspond to each other.

An embodiment relates to a novel magnetic domain structure observation method for observing a magnetic domain structure by measuring circularly polarized components of a characteristic X-ray. The characteristic X-ray contains an X-ray in a hard X-ray region which is highly penetrable; therefore, by measuring the circular polarization of such an X-ray in the hard X-ray region, it is possible to observe a magnetic domain structure at a depth of about several micrometers from the sample surface, which is difficult to measure by conventional techniques. This makes it possible to carry out precise measurement without strict limitations as to a sample, when observing a magnetic material.

[Remarks]

The present invention is not limited to the foregoing embodiments, but can be altered by a skilled person in the art within the scope of the claims. The present invention also encompasses, in its technical scope, any embodiment derived by combining technical means disclosed in differing embodiments.

REFERENCE SIGNS LIST 1 magnetic material observation apparatus
10 excitation beam source
11 electron source (electron gun)
12 electron optical system
13 sample stage
20 electron detector
21 control section (data processing section)
22 display section
30 detecting section
31 collimating optical system
32 wave plate
33 polarizer
34 X-ray detector
41, 42 slit
E1 electron beam (excitation beam)
E2 secondary electrons
H magnetic field
R synchrotron X-ray (synchrotron X-ray radiation: excitation beam)
S sample
X1, X2, X3 X-ray

The invention claimed is:

1. A magnetic material observation method for observing a direction of magnetization or a magnitude of magnetization of a sample that contains a magnetic material, the method comprising:
an irradiating step comprising irradiating a region of the sample with an excitation beam, the excitation beam being a beam that allows an element included in the magnetic material to radiate a characteristic X-ray upon irradiation of the sample with the beam;
a detecting step comprising recognizing, as intensities of two circularly polarized components in respective rotation directions, the characteristic X-ray radiated from the element upon irradiation of the sample with the excitation beam; and
a calculating step comprising calculating a difference between the intensities of the two circularly polarized components recognized in the detecting step.

2. The method according to claim 1, wherein the excitation beam is an electromagnetic wave beam.

3. The method according to claim 2, wherein the excitation beam is an electromagnetic wave beam which is other than X-rays.

4. The method according to claim 1, wherein the excitation beam is a charged particle beam.

5. A magnetic material observation apparatus for observing a direction of magnetization or a magnitude of magnetization of a sample that contains a magnetic material, the magnetic material observation apparatus comprising:
an excitation beam source configured to emit an excitation beam, the excitation beam being a beam that allows an element included in the magnetic material to radiate a characteristic X-ray upon irradiation of the sample with the beam;
a detecting section configured to detect the characteristic X-ray, radiated by the element upon irradiation of the sample with the excitation beam, as circularly polarized components different in direction of rotation, the circularly polarized components being a right-handed circularly polarized component and a left-handed circularly polarized component; and
a data processing section configured to carry out output of values each calculated from a difference between an intensity of the right-handed circularly polarized component and an intensity of the left-handed circularly polarized component.

6. The magnetic material observation apparatus according to claim 5, wherein:

the excitation beam source is configured to irradiate the sample with the excitation beam such that a position, irradiated with the excitation beam, of the sample sweeps; and the data processing section is configured to (i) recognize the values as the position irradiated with the excitation beam sweeps and (ii) carries out output of an image in which the values correspond to regions, irradiated with the excitation beam, of the sample.

7. The magnetic material observation apparatus according to claim 5, wherein the detecting section includes a quarter-wave plate for the characteristic X-ray.

8. The magnetic material observation apparatus according to claim 7, wherein the detecting section includes a polarizer configured to impart, to the characteristic X-ray that has passed through the quarter-wave plate and that contains a linearly polarized component, an intensity that differs according to a polarization direction.

9. The magnetic material observation apparatus according to claim 5, wherein the excitation beam is an electromagnetic wave beam.

10. The magnetic material observation apparatus according to claim 9, wherein the excitation beam is an electromagnetic wave beam which is other than X-rays.

11. The magnetic material observation apparatus according to claim 5, wherein the excitation beam is a charged particle beam.

12. The magnetic material observation apparatus according to claim 11, wherein the excitation beam is an electron beam, the magnetic material observation apparatus further comprising an image acquiring section configured to acquire a microscope image which is a scanning electron microscope image or a transmission electron microscope image, the data processing section being configured to carry out output of an image in which the microscope image and a region irradiated with the excitation beam are displayed such that the microscope image and the region correspond to each other.

13. The magnetic material observation apparatus according to claim 5, wherein a collimating optical system is provided between the sample and the detecting section, the collimating optical system being configured to collimate the characteristic X-ray.

14. The magnetic material observation apparatus according to claim 13, wherein the collimating optical system is comprised of a Montel multilayer mirror.

* * * * *